United States Patent

Higurashi et al.

[11] Patent Number: 5,679,961
[45] Date of Patent: Oct. 21, 1997

[54] CORRELATION TUNNEL DEVICE

[75] Inventors: Hitoshi Higurashi; Akira Toriumi, both of Yokohama; Fumiko Yamaguchi, Noda; Kiyoshi Kawamura, Tokyo, all of Japan; Alfred Hübler, Urbana, Ill.

[73] Assignee: Kabushiki Kaisha Toshiba, Kawasaki, Japan

[21] Appl. No.: 526,901

[22] Filed: Sep. 12, 1995

[30] Foreign Application Priority Data

Sep. 13, 1994 [JP] Japan .................. 6-218971

[51] Int. Cl.$^6$ .................................. H01L 29/06
[52] U.S. Cl. .................. 257/14; 257/15; 257/20; 257/24; 257/25
[58] Field of Search .................. 257/14, 15, 20, 257/24, 25

[56] References Cited

U.S. PATENT DOCUMENTS 5,440,148  8/1995  Nomoto .................. 257/25

FOREIGN PATENT DOCUMENTS 61-82472  4/1986  Japan .
5-82773   4/1993  Japan .................. 257/25

*Primary Examiner*—Minh-Loan Tran
*Attorney, Agent, or Firm*—Oblon, Spivak, McClelland, Maier & Neustadt, P.C.

[57] ABSTRACT

According to the present invention, there is provided a correlation tunnel device capable of achieving a low power consumption without decreasing a drive force when a large-scale-integrated circuit is constituted. A correlation tunnel device according to the present invention comprises a first quantum dot structure including a first carrier confinement region having at least two discrete energy levels, a carrier conduction region adjacent to the first carrier confinement region, and a tunnel barrier arranged only between the first carrier confinement region and the conduction region, and a second quantum dot structure including a second carrier confinement region having at least two discrete energy levels, a carrier conduction region adjacent to the second carrier confinement region, and a tunnel barrier arranged only between the second carrier confinement region and the conduction region, wherein an energy level occupied by the carrier in the first carrier confinement region and an energy level occupied by the carrier in the second carrier confinement region have a correlation.

13 Claims, 8 Drawing Sheets

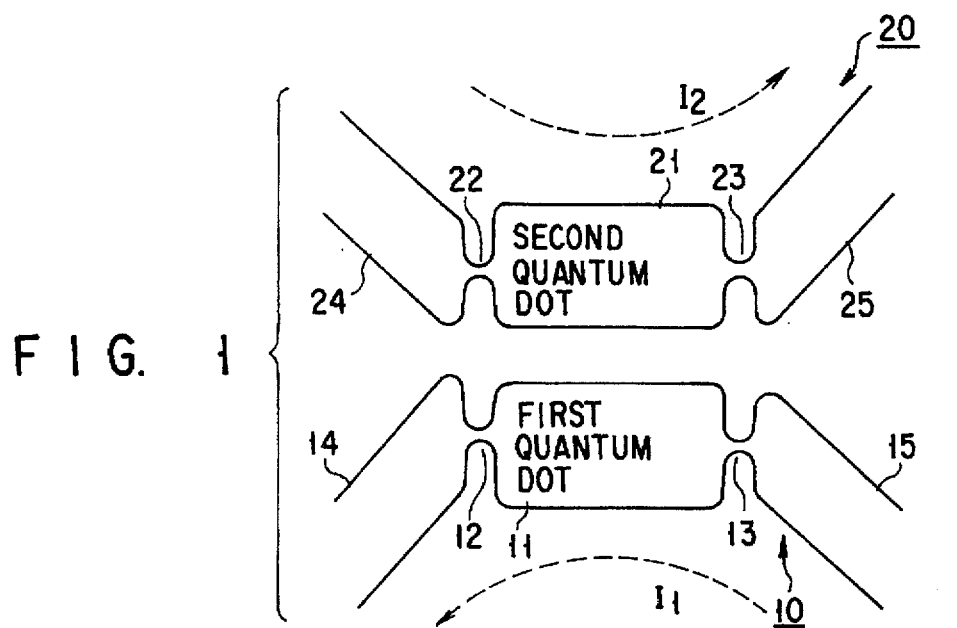
F I G. 1
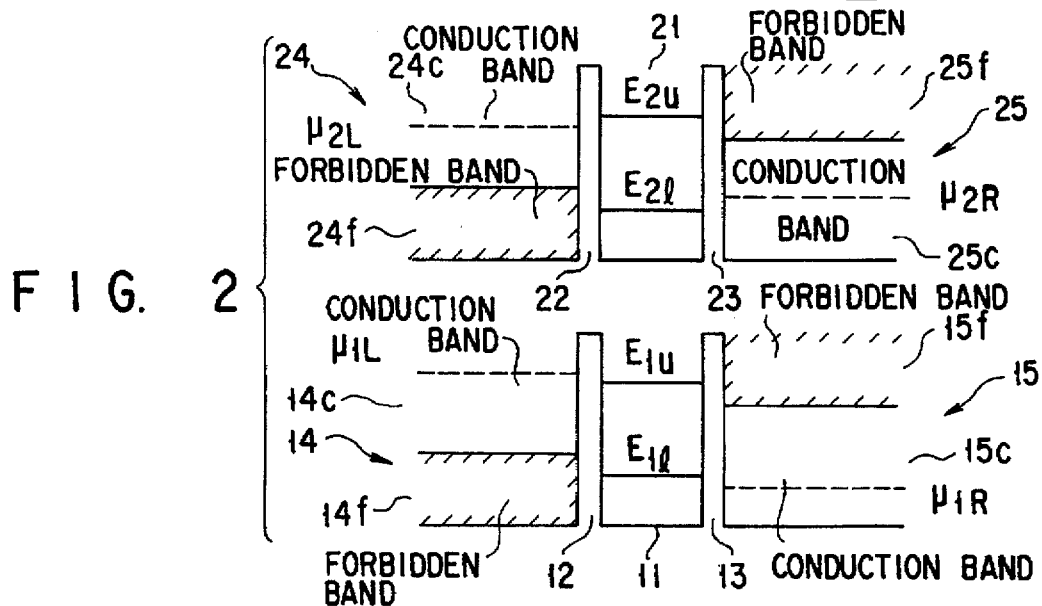
F I G. 2
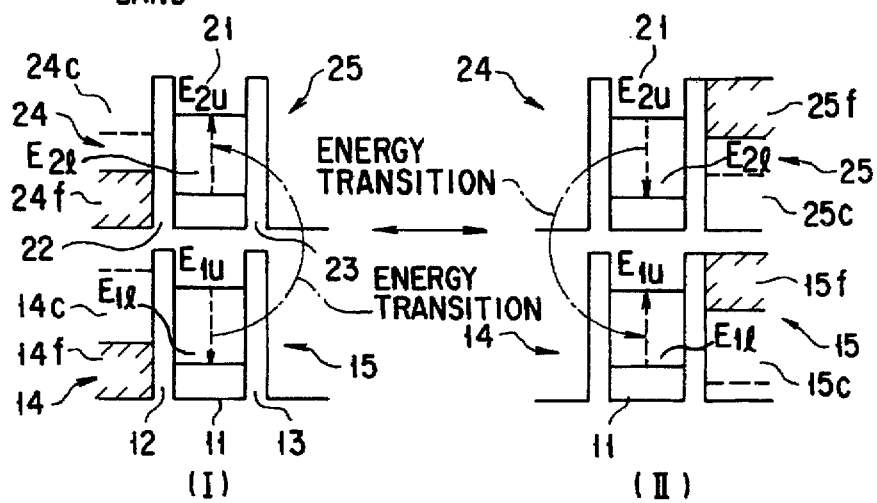
F I G. 3

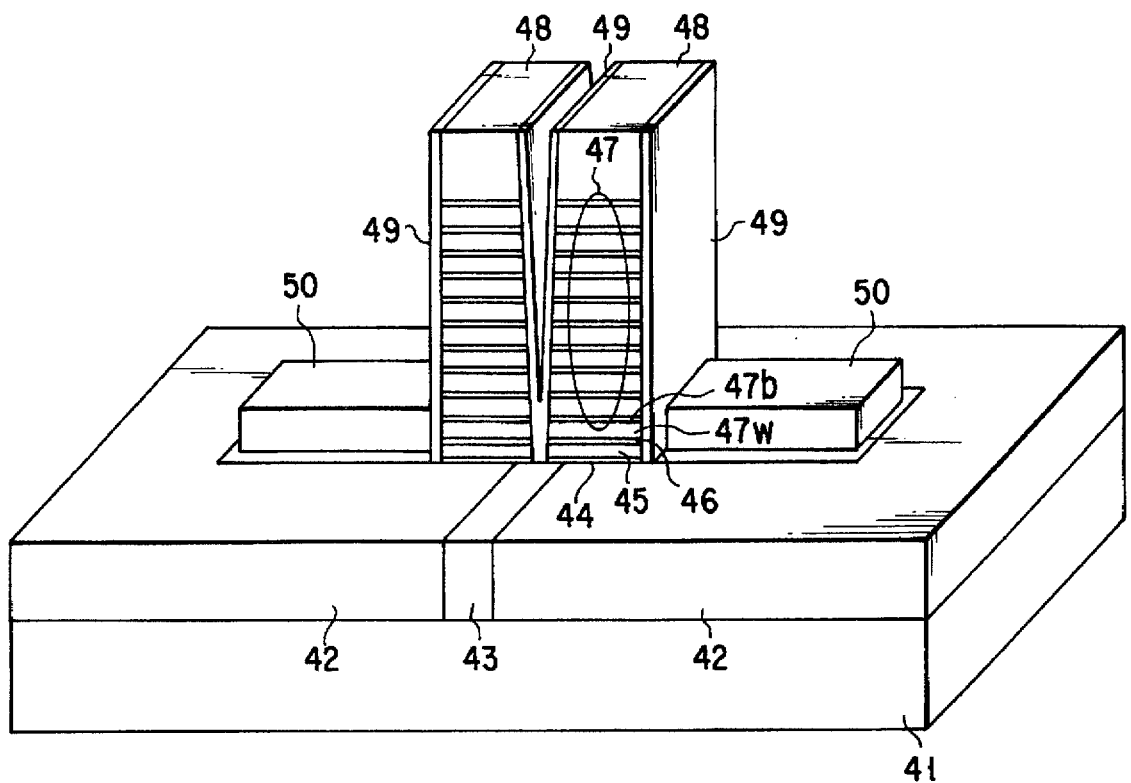
F I G. 14
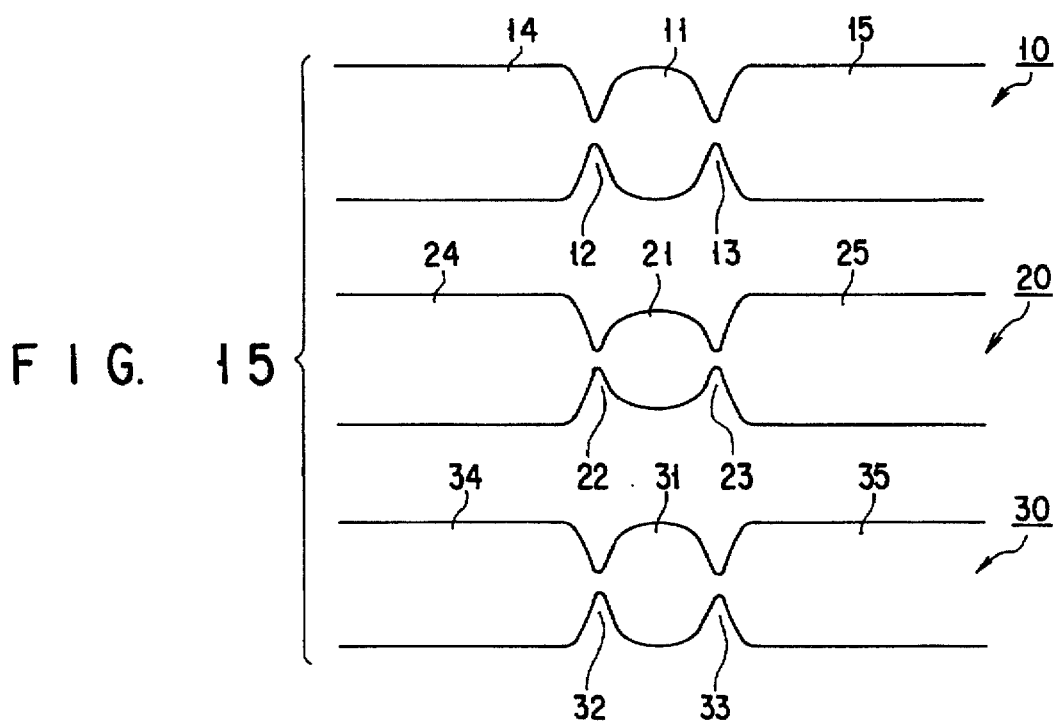
F I G. 15

CORRELATION TUNNEL DEVICE

BACKGROUND OF THE INVENTION

1. Field of the Invention

The present invention relates to a correlation tunnel device having quantum dot structures and, more particularly, to a Coulomb correlation tunnel device having a coupled quantum dot structure.

2. Description of the Related Art

When an external voltage is applied to a device consisting of a conductive material such as a semiconductor or a metal to cause carries to flow in the device, energy corresponding to the applied bias voltage must be consumed in this device in normal conductive states. The energy is generally given off as Joule heat by phonon scattering. For example, when a bias voltage V is applied across the source and drain regions of a field effect transistor such as a MOS-FET to cause charged carriers having a charge q to flow in the transistor, while the carriers flow from the source electrode to the drain electrode, energy qV corresponding to the bias voltage V applied across the source and drain regions is dissipated in the electrodes or substrate by phonon scattering to generate Joule heat. Assume that the transistor is operated at a low temperature to prevent phonon scattering from easily occurring, the intrinsic power consumption of the transistor is kept at qV.

In recent years, with micropatterning of active devices such as transistors serving as basic units constituting an LSI circuit, the LSI circuit tends to be large-scale-integrated at a high density. With this trend, it is pointed out that an increase in power consumption of the LSI circuit has been posed as a serious problem. Although various efforts to reduce the power consumption have been made, as estimated from the above, the energy qV must be decreased to reduce the intrinsic power consumption of the active device such as a transistor. This means low bias drive of the device. However, a drive force disadvantageously decreases at a low bias. Therefore, in order to obtain a proper drive force in an LSI circuit using conventional active devices which are micropatterned, the active devices must be operated at a bias voltage corresponding to the drive force. For this reason, there is an inevitable limit on the reduction of power consumption of a conventional active device.

SUMMARY OF THE INVENTION

It is an object of the present invention to provide a novel correlation tunnel device which can achieve a low power consumption without decreasing a drive force in constituting a large-scale-integrated circuit and has a plurality of quantum dot structures which are coupled to each other.

According to the present invention, there is provided a correlation tunnel device comprising: a first quantum dot structure including a first carrier confinement region having at least two discrete energy levels, a carrier conduction region adjacent to the first carrier confinement region, and a tunnel barrier arranged only between the first carrier confinement region and the conduction region; and a second quantum dot structure including a second carrier confinement region having at least two discrete energy levels, a carrier conduction region adjacent to the second carrier confinement region, and a tunnel barrier arranged only between the second carrier confinement region and the conduction region, wherein there are corrections between an energy level occupied by the carrier in the first carrier confinement region and an energy level occupied by the carrier in the second carrier confinement region.

In addition, according to the present invention, there is provided a correlation tunnel device comprising: a first quantum dot structure including a first carrier confinement region having at least two discrete energy levels, a carrier conduction region adjacent to the first carrier confinement region, and a tunnel barrier arranged only between the first carrier confinement region and the conduction region;

a second quantum dot structure including a second carrier confinement region having at least two discrete energy levels, a carrier conduction region adjacent to the second carrier confinement region, and a tunnel barrier arranged only between the second carrier confinement region and the conduction region;

a third quantum dot structure including a third carrier confinement region having at least two discrete energy levels, a carrier conduction region adjacent to the third carrier confinement region, and a tunnel barrier arranged only between the third carrier confinement region and the conduction region, an energy level occupied by the carrier in the first carrier confinement region and an energy level occupied by the carrier in the second carrier confinement region, and the energy level occupied by the carrier in the second carrier confinement region and an energy level occupied by the carrier in the third carrier confinement region have correlations, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a schematic diagram showing a correlation tunnel device having two quantum dot structures according to the first embodiment of the present invention;

FIG. 2 is a typical energy band diagram in the correlation tunnel device shown in FIG. 1;

FIG. 3 is a view showing two-state transition between the two quantum dot structures in FIG. 1;

FIG. 14 is a perspective view showing a completed device structure obtained in the manufacturing steps of FIGS. 9 to 13;

FIG. 15 is a schematic diagram showing a correlation tunnel device having three quantum dot structures according to the sixth embodiment of the present invention;

DETAILED DESCRIPTION OF THE PREFERRED EMBODIMENTS

Figure 4:
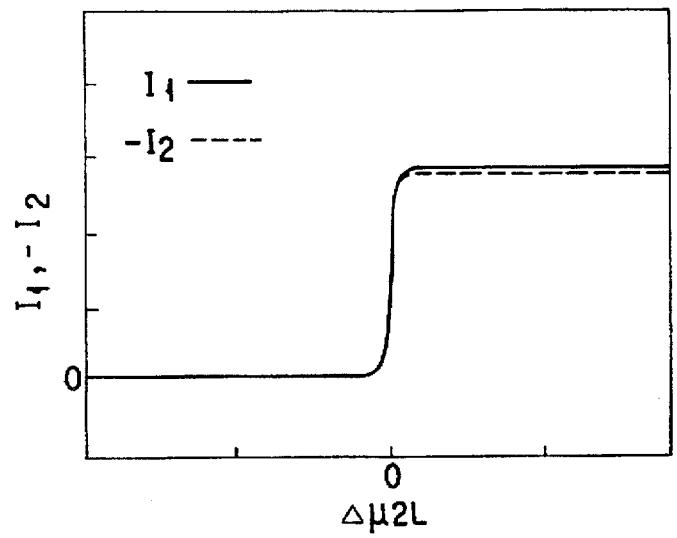
FIG. 4 is a graph showing a current-voltage characteristic curve obtained when a correlation tunnel device according to the second embodiment of the present invention is applied as a three-terminal device.

A correlation tunnel device according to the present invention comprises: a first quantum dot structure including a first carrier confinement region having at least two discrete energy levels, a carrier conduction region adjacent to the first carrier confinement region, and a tunnel barrier arranged only between the first carrier confinement region and the conduction region; and a second quantum dot structure including a second carrier confinement region having at least two discrete energy levels, a carrier conduction region adjacent to the second carrier confinement region, and a tunnel barrier arranged only between the second carrier confinement region and the conduction region, and has the following characteristic features (I) to (III).

(I) A transfer of a carrier from and to the carrier conduction region adjacent thereto through the first carrier confinement region is performed by changing energy level occupied by the carrier in the first carrier confinement region.

(II) A transfer of a carrier from and to carrier conduction region adjacent thereto through the second carrier confinement region is performed by changing energy level occupied by the carrier in the second carrier confinement region.

(III) There are correlations between an energy level occupied by the carrier in the first carrier confinement region and an energy level occupied by the carrier in the second carrier confinement region.

The first quantum dot structure is allowed to be constituted by two carrier conduction regions arranged adjacent to the first carrier confinement region. In this case, tunnel barriers are arranged only between the first carrier confinement region and the two carrier conduction regions adjacent thereto, respectively. In such a first quantum dot structure, the transfer of a carrier described in (I) is performed as follows.

The carrier tunnel from one of the conduction regions to the first carrier confinement region through the tunnel barrier, and the carriers having energy changed in the confinement region tunnel to the other conduction region through the tunnel barrier. The change in energy of the carrier in the first confinement region is performed by transition from an energy level obtained in the confinement region mainly contributing to a transfer of carriers between the first carrier confinement region and one of the conduction regions to an energy level obtained in the confinement region mainly contributing to a transfer of carriers between the first carrier confinement region and the other conduction region.

The second quantum dot structure is allowed to be constituted by two carrier conduction regions arranged adjacent to the second carrier confinement region. In this case, tunnel barriers are arranged only between the second carrier confinement region and the two carrier conduction regions adjacent thereto, respectively. In such a second quantum dot structure, the transfer of a carrier described in (II) is performed as follows.

The carriers tunnel from one of the conduction regions to the second carrier confinement region through the tunnel barrier, and the carriers having energy changed in the confinement region tunnel to the other conduction region through the tunnel barrier. The change in energy of the carrier in the second confinement region is performed by transition from an energy level obtained in the confinement region mainly contributing to a transfer of carriers between the second carrier confinement region and one of the conduction regions to an energy level obtained in the confinement region mainly contributing to a transfer of carriers between the second carrier confinement region and the other conduction region.

The tunnel device according to the present invention is allowed to have a means for controlling the electrochemical potential of one or more conduction region among the conduction regions each having an electrochemical potential.

The correlation described in (III) is generated, e.g., by Coulomb interaction acting between charged carriers in the first and second carrier confinement regions. This correlation can be realized by arranging the first and second carrier confinement regions adjacent to each other.

The tunnel correlation device according to the present invention is allowed to have, in the structure in which the first and second carrier confinement regions are arranged adjacent to each other, a means for controlling the magnitude of the Coulomb interaction acting on the carriers in the first and second carrier confinement regions.

The above correlation tunnel device according to the present invention comprises: a first quantum dot structure including a first carrier confinement region having at least two discrete energy levels, a carrier conduction region adjacent to the first carrier confinement region, and a tunnel barrier arranged only between the first carrier confinement region and the conduction region; and a second quantum dot structure including a second carrier confinement region having at least two discrete energy levels, a carrier conduction region adjacent to the second carrier confinement region, and a tunnel barrier arranged only between the second carrier confinement region and the conduction region, and has the above characteristic features (I) to (III). In this correlation tunnel device, since energy is transferred between circuits by inter-quantum-state oscillations generated by an interaction between the first and second quantum dot structures excessive energy externally given off as Joule heat by phonon scattering or the like as in a conventional active device can be recovered. When this mechanism is used, energy dissipation can be reduced even if an operation is performed at a relatively high bias voltage, and a device which achieves a lower power consumption can be realized without decreasing a drive force.

An other correlation tunnel device according to the present invention comprises: a first quantum dot structure including a first carrier confinement region having at least two discrete energy levels, a carrier conduction region adjacent to the first carrier confinement region, and a tunnel barrier arranged only between the first carrier confinement region and the conduction region;

a second quantum dot structure including a second carrier confinement region having at least two discrete energy levels, a carrier conduction region adjacent to the second carrier confinement region, and a tunnel barrier arranged only between the second carrier confinement region and the conduction region;

a third quantum dot structure including a third carrier confinement region having at least two discrete energy levels, a carrier conduction region adjacent to the third carrier confinement region, and a tunnel barrier arranged only between the third carrier confinement region and the conduction region, and has the following characteristic features (I) to (IV).

(I) A transfer of a carrier from and to the carrier conduction region adjacent thereto through the first carrier confinement region is performed by changing energy level occupied by the carrier in the first carrier confinement region.

(II) A transfer of a carrier from and to the carrier conduction region adjacent thereto through the second carrier confinement region is performed by changing energy level occupied by the carrier in the second carrier confinement region.

(III) A transfer of a carrier from and to the carrier conduction region adjacent thereto through the third carrier confinement region is performed by changing energy level occupied by the carrier in the third carrier confinement region.

(IV) There are correlations between an energy level occupied by the carrier in the first carrier confinement region and an energy level occupied by the carrier in the second carrier confinement region, and between the energy level occupied by the carrier in the second carrier confinement region and an energy level occupied by the carrier in the third carrier confinement region, respectively.

The first quantum dot structure is allowed to be constituted by two carrier conduction regions arranged adjacent to the first carrier confinement region. In this case, tunnel barriers are arranged only between the first carrier confinement region and the two carrier conduction regions adjacent thereto, respectively. In such a first quantum dot structure, the transfer of a carrier described in (I) is performed as follows.

The carriers tunnel from one of the conduction regions to the first carrier confinement region through the tunnel barrier, and the carriers having energy changed in the confinement region tunnel to the other conduction region through the tunnel barrier. The change in energy of the carrier in the first confinement region is performed by transition from an energy level obtained in the confinement region mainly contributing to a transfer of carriers between the first carrier confinement region and one of the conduction regions to an energy level obtained in the confinement region mainly contributing to a transfer of carriers between the first carrier confinement region and the other conduction region.

The second quantum dot structure is allowed to be constituted by two carrier conduction regions arranged adjacent to the second carrier confinement region. In this case, tunnel barriers are arranged only between the second carrier confinement region and the two carrier conduction regions adjacent thereto, respectively. In such a second dot structure, the exchange of a carrier described in (II) is performed as follows.

The carrier tunnel from one of the conduction regions to the second carrier confinement region through the tunnel barrier, and the carrier having energy changed in the confinement region tunnel to the other conduction region through the tunnel barrier. The change in energy of the carrier in the second confinement region is performed by transition from an energy level obtained in the confinement region mainly contributing to an exchange of a carrier between the second carrier confinement region and one of the conduction regions to an energy level obtained in the confinement region mainly contributing to an exchange of a carrier between the second carrier confinement region and the other conduction region.

The third dot structure is allowed to be constituted by two carrier conduction regions arranged adjacent to the third carrier confinement region. In this case, tunnel barriers are arranged only between the third carrier confinement region and the two carrier conduction regions adjacent thereto, respectively. In such a third quantum dot structure, the exchange of the carrier described in (III) is performed as follows.

The carriers tunnel from one of the conduction regions to the third carrier confinement region through the tunnel barrier, and the carriers having energy changed in the confinement region tunnel to the other conduction region through the tunnel barrier. The change in energy of the carrier in the third confinement region is performed by transition from an energy level obtained in the confinement region mainly contributing to a transfer of carriers between the third carrier confinement region and one of the conduction regions to an energy level obtained in the confinement region mainly contributing to a transfer of carriers between the third carrier confinement region and the other conduction region.

The tunnel device according to the present invention is allowed to have a means for controlling the electrochemical potential of one or more conduction region among the conduction regions each having an electrochemical potential.

The correlations of energy levels between the first and second carrier confinement regions described in (IV) are generated by, e.g., Coulomb interaction acting between charged carriers in the first and second carrier confinement regions. This correlation can be realized by arranging the first and second carrier confinement regions adjacent to each other. The correlations of energy levels between the second and third carrier confinement regions described in (IV) is generated by, e.g., Coulomb interaction acting between charged carriers in the second and third carrier confinement regions. This correlation can be realized by arranging the second and third carrier confinement regions adjacent to each other.

The other correlation tunnel device according to the present invention is allowed to have, in the structure in which the first and second carrier confinement regions are arranged adjacent to each other and in which the second and third carrier confinement regions are arranged adjacent to each other, a means for controlling the magnitude of the Coulomb interaction acting on the carriers in the first and second carrier confinement regions and a means for controlling the magnitude of the Coulomb interaction acting on the carriers in the second and third carrier confinement regions.

The above other correlation tunnel device according to the present invention comprises: a first quantum dot structure including a first carrier confinement region having at least two discrete energy levels, a carrier conduction region adjacent to the first carrier confinement region, and a tunnel barrier arranged only between the first carrier confinement region and the conduction region, a second quantum dot structure including a second carrier confinement region having at least two discrete energy levels, a carrier conduction region adjacent to the second carrier confinement region, and a tunnel barrier arranged only between the second carrier confinement region and the conduction region, a third quantum dot structure including a third carrier confinement region having at least two discrete energy levels, a carrier conduction region adjacent to the third carrier confinement region, and a tunnel barrier arranged only between the third carrier confinement region and the conduction region, and has the above characteristic features (I) to (IV). In this correlation tunnel device, since energy is transferred between circuits by inter-quantum-state oscillations generated by an interaction between the quantum dot structures, excessive energy externally given off as Joule heat by phonon scattering or the like as in a conventional active device can be recovered. When this mechanism is used, energy dissipation can be reduced even if an operation is performed at a relatively high bias voltage, and a device which achieves a lower power consumption can be realized without decreasing a drive force.

The present invention will be described in greater detail below by of its preferred embodiments.

(First Embodiment)

In the first embodiment, a basic operation of a correlation tunnel device will be described below by using physical characteristics such as "spatial correlation of charged carriers caused by Coulomb interaction" described in the background of the invention and using an example wherein electrons are used as charged carriers to easily understand the following description.

FIG. 1 is a diagram showing a correlation tunnel device according to the first embodiment. A first quantum dot structure 10 is constituted by a first confinement region (quantum dot) 11, fist and second conduction regions 14 and 15 adjacent to the first confinement region 11, and first and second energy barriers 12 and 13 respectively arranged only between the first quantum dot 11 and the first and second conduction regions 14 and 15. A second quantum dot structure 20 is constituted by a second confinement region (quantum dot) 21, third and fourth conduction regions 24 and 25 adjacent to the second quantum dot 21, and third and fourth energy barriers 22 and 23 respectively arranged only between the second quantum dot 21 and the third and fourth conduction regions 24 and 25. In general, in a quantum dot with a discrete energy level structure, the energy level interval is in inverse proportion to the square of the characteristic length representing the size of the quantum dot. More specifically, as the quantum dot becomes small in size, the energy level interval increases in inverse proportion to the square of the characteristic length of the quantum dot. Therefore, when the quantum dot is sufficiently small in size, a situation considered as a two-level system consisting of a ground level and a first excitation level can be formed. For ease of a description, a case wherein the following conditions (1) and (2) are satisfied will be described below. (1) Assume that the size of each quantum dot is sufficiently small, and that, as shown in FIG. 2, two levels, i.e., a ground energy level and a first excitation energy level are formed in each quantum dot. (2) Assume that the confinement potentials of the first and second quantum dots 11 and 21 can be approximated to square well potentials as shown in the energy band structure in FIG. 2.

As shown in FIG. 2, the first quantum dot 11 has a quantum state consisting of an energy level $E_{1l}$ (ground level) and an energy level $E_{1u}$ (first excitation level), and the second quantum dot 21 has a quantum state consisting of an energy level $E_{2l}$ (ground level) and an energy level $E_{2u}$ (first excitation level), where relationships $E_{1l}<E_{1u}$ and $E_{2l}<E_{2u}$ are satisfied. At this time, the first and second conduction regions 14 and 15 adjacent to the first quantum dot 11 are formed such that their energy bands have a structure shown in FIG. 2. The third and fourth conduction regions 24 and 25 adjacent to the second quantum dot 21 are formed such that their energy bands have a structure shown in FIG. 2.

More specifically, in the first quantum dot structure 10, one conduction region (first conduction region 14) has an energy band structure in which a conduction band 14c is put on a forbidden band 14f in order of energy. In this region, the upper band edge of the forbidden band 14f is higher than the ground energy level $E_{1l}$ of the first quantum dot 11 and lower than the excitation energy level $E_{1u}$. That is, the forbidden band 14f extends over the energy region such that electrons do not directly tunnel between the conduction band 14c above the forbidden band 14f and the ground energy level $E_{1l}$ of the first quantum dot 11. The other conduction region (second conduction region 15) has an energy band structure in which a forbidden band 15f is put on a conduction band 15c in order of energy. The conduction band 15c extends to the energy region lower than the excitation level $E_{1u}$ of the first quantum dot 11 which contains the energy level $E_{1l}$ of the first quantum dot 11 and the forbidden band 15f is put on the conduction band 15c and extends and extends over the energy region including the excitation level $E_{1u}$ of the first quantum dot 11 such that electrons do not directly tunnel between the excitation level $E_{1u}$ of the first quantum dot 11 and the conduction band 15c.

In addition, as in the first quantum dot structure 10, in the second quantum dot structure 20, one conduction region (third conduction region 24) has an energy band structure in which a conduction band 24c is put on a forbidden band 24f in order of energy. In this region, the upper band edge of the forbidden band 24f is higher than the energy level $E_{2l}$ of the quantum dot 21 and lower than the excitation level $E_{2u}$. That is, the forbidden band 24f extends over the energy region such that electrons do not directly tunnel between the conduction band 24c above the forbidden band 24f and the ground energy level $E_{2l}$ of the second quantum dot 21. The other conduction region (fourth conduction region 25) has an energy band structure in which a forbidden band 25f is put on a conduction band 25c in order of energy. However, the conduction band 25c extends to the energy region lower than the excitation level $E_{2u}$ of the second quantum dot 21 which contains the ground energy level $E_{2l}$ of the second quantum dot 21 and the forbidden band 25f is put on the conduction band 25c and extends over the energy region including the excitation level $E_{2u}$ of the second quantum dot 21 such that electrons do not directly tunnel between the excitation level $E_{2u}$ of the second quantum dot 21 and the conduction band 25c.

Using these energy band structures of the conduction regions, conduction regions to which electrons in the first (second) quantum dot 11 (21) can tunnel through the tunnel barriers depend on the energy levels at which these electrons stay in the quantum dot. For example, in the first quantum dot 11, if an electron exists at the ground energy level $E_{1l}$ of the first quantum dot 11, the electrons can tunnel to only the second conduction region 15 having the conduction band 15c near the energy level $E_{1l}$ through the second energy barrier 13, but cannot tunnel to the other conduction region, i.e., the first conduction region 14. On the other hand, if an electron exists at the excitation level $E_{1u}$ of the first quantum dot 11, the electron can tunnel to only the first conduction region 14 having the conduction band 14c near the excitation level $E_{1u}$ through the first energy barrier 12. In the second quantum dot 21, the same electron tunneling as in the first quantum dot 11 occurs between the third conduction region 24 and the second quantum dot 21 and between the fourth conduction region 25 and the second quantum dot 21.

In this case, although a forbidden band is used as a region in which an electron cannot exist, anything state having no energy level to ply the rule equivalent to the forbidden band, e.g., any available for electrons can be substituted for the forbidden band. Similarly, not only a conduction band, but also any state having an energy level contributing to conduction can be used.

The first and second quantum dots 11 and 21 having the above energy levels and band structures, which belong to the first and second quantum dot structures 10 and 20, are arranged adjacent to each other such that electrons in these quantum dots 11 and 21 interact to each other, thereby constituting a coupled-quantum-dot structure. In the following, it is assumed that all target quantum dot structures have the following characteristic features.

(a) A probability that two or more electrons exist in one quantum dot is very low. That is, only one electron can exist in one quantum dot in many cases. For example, an electron occupies either one of the two energy levels $E_{1l}$ and $E_{1u}$ of the first quantum dot.

(b) If electrons enter two quantum dots, it rarely occurs that electrons simultaneously occupy energy levels with the same symmetry in both the quantum dots. For example, if an electron exists at the ground energy level $E_{1l}$ in the first quantum dot 11, an electron enters the other energy level (excitation level) $E_{2u}$ in the second quantum dot 21. That is, when electrons enters two quantum dots, the electrons occupy different energy levels.

The details of (a) will be described below. That is, since the intra-dot Coulomb interaction becomes very strong in a small quantum dot, two or more electrons are energetically prevented from simultaneously entering the same quantum dot.

The details of (b) will be described below. That is, since electrons are spatially close to each other in high probability when the wave functions in two quantum dots have the same symmetry, a Coulomb interaction between the quantum dots is enhanced. More specifically, the electrons tend to enter different energy levels in the two quantum dots because the wave functions in the two quantum dots have the same symmetry if electrons would enter the same energy levels in both the quantum dots.

Although both the phenomena occurring in (a) and (b) are caused by a spatial Coulomb correlation, the phenomenon of (a) is caused by the Coulomb correlation in a quantum dot, and the phenomenon of (b) is caused by the Coulomb correlation between quantum dots.

Assume that electrons exist in two dots (first and second quantum dots 11 and 12) on the basis of the phenomena of (a) and (b). As shown in (I) of FIG. 3, suppose that a state wherein electrons respectively exist at the excitation level $E_{1u}$ of the first quantum dot 11 and the ground energy level $E_{2l}$ of the second quantum dot 21 is an initial state. After a while, as shown in (II) of FIG. 3, the state changes into a state wherein the electrons respectively exist at the ground energy level $E_{1l}$ of the first quantum dot 11 and the excitation level $E_{2u}$ of the second quantum dot 21. More specifically, when the level of the electron existing at the excitation level $E_{1u}$ of the first quantum dot 11 falls into the ground energy level $E_{1l}$, the level of the electron existing at the ground energy level $E_{2l}$ of the second quantum dot 21 is raised to the excitation level $E_{2u}$ as shown in (II) of FIG. 3 by the intra-dot Coulomb correlations in the first and second quantum dots 11 and 21 and intra-dot Coulomb correlations between the first and second quantum dots 11 and 21 described in (a) and (b). After a while, this state returns to the state shown in (I) of FIG. 3. As described above, when electrons are in the first and second quantum dots 11 and 21 of the coupled-quantum-dot structure, oscillations occur between the states shown in (I) and (II) of FIG. 3. The frequency of oscillations per unit time is in proportion to the strength of coupling between the first and second quantum dots 11 and 21.

As described above, by using the oscillations between the two states (I) and (II) in FIG. 3 occurring by coupling between the two quantum dots 11 and 21, the way electrons flow in a correlation tunnel device consisting of the first and second quantum dot structures 10 and 20 shown in FIGS. 1 and 2 will be described below. Note that, in the first and second conduction regions 14 and 15 adjacent to the first quantum dot 11, the electrochemical potential of the first conduction region 14 having the conduction band 14c extending over the excitation level $E_{1u}$ of the first quantum dot 11 is represented by $\mu_{1L}$, and the electrochemical potential of the second conduction region 15 having the conduction band 15c extending over the ground energy level $E_{1l}$ of the first quantum dot 11 is represented by $\mu_{1R}$. Similarly, in the third and fourth conduction regions 24 and 25 adjacent to the second quantum dot 21, the electrochemical potential of the third conduction region 24 having the conduction band 24c extending over the excitation level $E_{2u}$ of the second quantum dot 21 is represented by $\mu_{2L}$, and the electrochemical potential of the fourth conduction region 25 having the conduction band 25c extending over the ground energy level $E_{2l}$ of the second quantum dot 21 is represented by $\mu_{2R}$.

A voltage is applied to the first quantum dot structure 10 such that the electrochemical potentials $\mu_{1L}$ and $\mu_{1R}$ of the first and second conduction regions 14 and 15 in the first quantum dot structure 10 satisfy the following condition:

$$\mu_{1L} > E_{1u} > E_{1l} > \mu_{1R}. \quad (1)$$

By applying such a voltage, an electron in the conduction band 14c of the first conduction region 14 is to be able to tunnel to the excitation level $E_{1u}$ of the first quantum dot 11 through the first energy barrier 12. However, the electron tunneling to the excitation level $E_{1u}$ of the first quantum dot 11 cannot tunnel to the other conduction region coupled to the first quantum dot 11, i.e., the second conduction region 15 without charging the energy of the electron. This is because the second conduction region 15 has the forbidden band 15f extending over the excitation level $E_{1u}$. Therefore, once the electron transferred to the first quantum dot 11 passes through a process in which the electron falls to the lower energy level (ground energy level) $E_{1l}$ of the first quantum dot 11, the electron is able to tunnel from the ground energy level $E_{1l}$ of the first quantum dot 11 to the conduction band 15c of the second conduction region 15. In general, the processes in which the level of an electron in the quantum dot changes from the excitation level $E_{1u}$ to the ground energy level $E_{1l}$ are accompanied by an energy dissipation processes such as phonon scattering. When such energy dissipation occurs, not only generation of Joule heat equivalent to the difference between $E_{1u}$ and $E_{1l}$, but also an increase in power consumption are caused.

In the coupled quantum dot structure according to the present invention, as described in (I) and (II) of FIG. 3, the quantum mechanical transition between two states is caused by coupling between the first and second quantum dots 11 and 21. More specifically, in the coupled-quantum-dot structure, the level of an electron is raised from the ground energy level $E_{1l}$ ($E_{2l}$) to the excitation level $E_{1u}$ ($E_{2u}$), and the level of the electron falls from the excitation level $E_{2u}$ ($E_{1u}$) to the ground energy level $E_{2l}$ ($E_{1l}$). By using the oscillations caused by the inter-state transition, the level of an electron in the first quantum dot 11 can fall from the excitation level $E_{1u}$ to the ground energy level $E_{1l}$ without energy loss caused by phonon scattering. Therefore, excessive generation of Joule heat can be suppressed by the above effect, so that the power consumption of the device can be reduced.

Under the condition satisfying (1), the electron exists at the excitation level $E_{1u}$ of the first quantum dot 11 due to tunneling from the first conduction region 14. Therefore, in order to cause the inter-state oscillations between the quantum states (I) and (II), the electron in the second quantum dot 21 must be supplied to energy level excluding the excitation energy level $E_{2u}$, i.e., the ground energy level $E_{2l}$ of the second quantum dot 21.

For this reason, a voltage is applied to the third and fourth conduction regions 24 and 25 in the second quantum dot structure 20 such that the electrochemical potentials $\mu_{2L}$ and $\mu_{2R}$ of the conduction regions 24 and 25 satisfy the following condition:

$$E_{2l} < \mu_{2R} < \mu_{2L} < E_{2u}. \quad (2)$$

By applying the voltage, an electron in the conduction band 25c of the fourth conduction region 25 is to be able to tunnel to the ground energy level $E_{2l}$ of the second quantum dot 21 through the fourth energy barrier 23. The electron tunneling to the ground energy level $E_{2l}$ of the second quantum dot 21 cannot tunnel to the other conduction region coupled to the second quantum dot 21, i.e., the third conduction region 24. This is because the third conduction region 24 to which the electron tunnels has the forbidden band 24f extending over the ground energy level $E_{2l}$. This state corresponds to the state (I) of FIG. 3. In the coupled-quantum-dot system in which the electron tunneling from the first conduction region 14 exists at the excitation level $E_{1u}$ of the first quantum dot 11 and which the electron tunneling from the fourth conduction region 25 exists at the ground energy level $E_{2l}$ of the second quantum dot 21, when inter-state oscillations occur, in the case of ideal, the state (I) can be changed into the state (II) in FIG. 3 without any energy loss. The dissipation of energy actually depends on $\Delta E_2 - \Delta E_1$, where $\Delta E_i$ (i=1, 2) is the difference between the energy levels $E_{iu}$ and $E_{il}$ which the i-th quantum dot may have, namely $E_{iu} - E_{il}$. Inter-state oscillations take place even when $\Delta E_2$ and $\Delta E_1$ are different. The loss of energy is minimized when $\Delta E_2$ and $\Delta E_1$ are equal. Hence, it is desirable that the quantum dots 11 and 21 be made such that $\Delta E_2$ and $\Delta E_1$ are equal. With this effect, the level of the electron in the first quantum dot 11 falls from the excitation level $E_{1u}$ to the ground energy level $E_{1l}$, and the level of the electron in the second quantum dot 21 is raised from the ground energy level $E_{2l}$ to the excitation level $E_{2u}$. The electron falling to the ground energy level $E_{1l}$ in the first quantum dot 11 tunnels to the conduction band 15c of the second conduction region 15 through the second energy barrier 13. On the other hand, the electron having the level raised to the excitation level $E_{2u}$ in the second quantum dot 21 tunnels to the conduction band 24c of the third conduction region 24 through the third energy barrier 22.

When the above processes are repeated, in the first quantum dot structure 10, the electron flows from the first conduction region 14 to the second conduction region 15 through the first quantum dot 11 (a current flows in the reverse direction). On the other hand, in the second quantum dot structure 20, the electron is raised from the fourth conduction region 25 to the third conduction region 24 through the second quantum dot 21 (a current flows in the reverse direction). In this case, it is remarkable that the current flows from the low-potential region to the high-potential region in the second quantum dot structure 20. Therefore, in this process, although energy of $(\mu_{1L}-\mu_{1R})$ is consumed in the first quantum dot structure 10, energy corresponding to $(\mu_{2L}-\mu_{2R})$ is recovered in the second quantum dot structure 20. For this reason, a power consumption can be reduced. Here it should be noted that $\mu_{1L}-\mu_{1R}$ is the energy that should be consumed in a conventional element such as a MOSFET.

(Second Embodiment)

The second embodiment describes that a three-terminal switching device can be constituted by using the correlation tunnel device in the first embodiment described above.

In the above correlation tunnel device, for example, the first and second conduction regions 14 and 15 coupled with both the sides of the first quantum dot 11 are used as source and drain electrodes, respectively, and the third conduction region 24 coupled to the second quantum dot 21 is used as a gate electrode, thereby constituting a three-terminal switching element.

FIG. 4 is a graph showing current-voltage characteristics representing changes in currents $I_1$ and $I_2$ flowing in a circuit system including the first and second dot structures when the electrochemical potential $\mu_{2L}$ is changed by a gate voltage applied to the third conduction region 24. The abscissa in FIG. 4 indicates $\Delta\mu_{2L} = E_{2u} - \mu_{2L}$. That is, this is a potential value measured in the direction from the excitation level $E_{2u}$ to $\mu_{2L} < E_{2u}$, and a direction in which the applied voltage is increased corresponds to a direction in which the value $\Delta\mu_{2L}$ is increased. Each current flowing from a high-potential region to a low-potential region is considered as a positive current. In FIG. 4, the current $I_1$ is indicated by a solid line, and a current $-I_2$ is indicated by a broken line. As is apparent from FIG. 4, the tunnel device designed to have three terminals uses the third conduction region 24 as a gate electrode, when the electrochemical potential $\mu_{2L}$ of the third conduction region 24 and the excitation level $E_{2u}$ are satisfied $\mu_{2L} < E_{2u}$ by changing an applied voltage of the gate electrode, a current abruptly flows, and a sharp switching characteristic curve is obtained.

Figure 5:
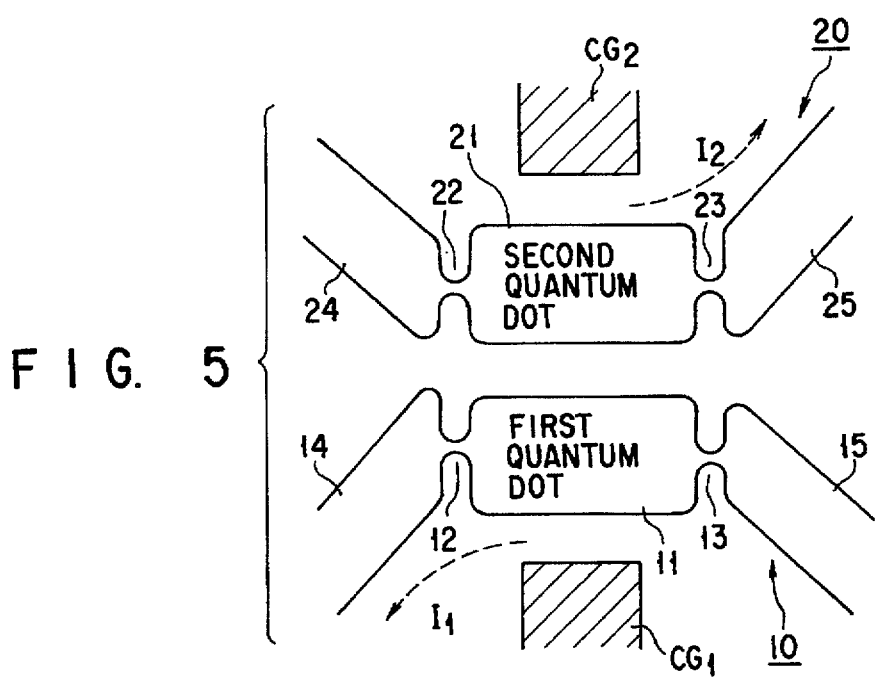
FIG. 5 is a schematic diagram showing a correlation tunnel device having control gates for controlling the strength of coupling between the first and second quantum dots of the correlation tunnel device according to the first embodiment.
Figure 6:
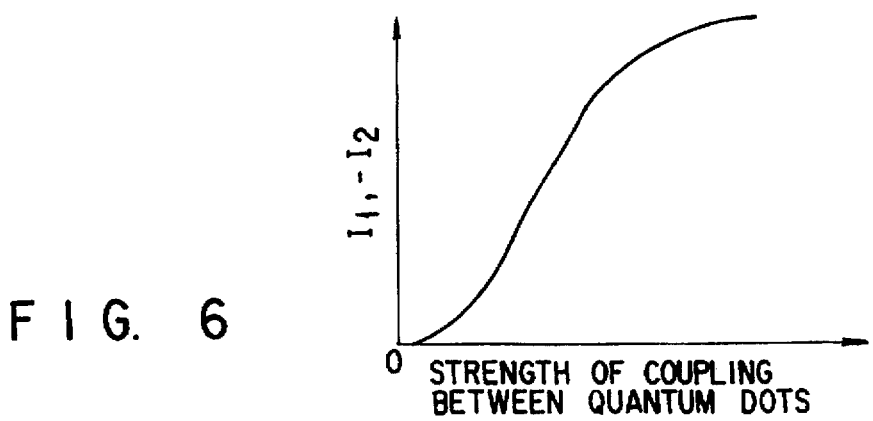
FIG. 6 is a graph showing a change in current level obtained when the coupling strength between the first and second quantum dots is changed.

The energy transfer efficiency between the first and second quantum dots depends on the strength of coupling between these quantum dots, in other words, the rate of inter-state oscillations. By using this phenomenon, the current level of the three-terminal switching device can be controlled. In order to the strength of coupling between the first and second quantum dots, as shown in FIG. 5, control gates $CG_1$ and $CG_2$ are arranged around the first and second quantum dots 11 and 21, and the potentials or electron densities of the control gates $CG_1$ and $CG_2$ are adjusted. More specifically, in the arrangement of the control gates $CG_1$ and $CG_2$ shown in FIG. 5, i.e., an arrangement in which the control gates $CG_1$ and $CG_2$ are arranged on both the sides of the first and second quantum dots 11 and 21 to sandwich them, when the electron densities of the control gates $CG_1$ and $CG_2$ are increased, the strength of coupling between the first and second quantum dots 11 and 21 is enhanced. FIG. 6 shows a change in current level when the value $\Delta\mu_{2L}$ is fixed to a value at which the current flows in the graph showing current-voltage characteristics in FIG. 4, and the electron densities of the control gates $CG_1$ and $CG_2$ are adjusted to make the strength of coupling between the first and second quantum dots 11 and 21 change. When the above new gate structure is employed, the switching characteristics can be also controlled.

Note that any control gates which can control the strength of coupling between the quantum dots can be used. For example, the control gates may be arranged only around one quantum dot, or a magnetic member may be used in place of the control gate to define the spin of the electrons entering the first and second quantum dots, thereby controlling the correlation between the quantum dots. In addition, the control gates may be formed by arranging conductive layers between two quantum dots.

Furthermore, the energy transfer efficiency between the first and second quantum dots changes depending on the strength of coupling between a quantum dot and a conduction regions. This effect can be also used to control the switching characteristics. For example, when the width or potential height of a tunnel barrier is controlled to change the facility of tunneling of an electron from the quantum dot to the conduction region, the switching characteristics can be controlled.

(Third Embodiment)

The third embodiment describes an example wherein the above switching device is applied to a memory.

Figure 7:
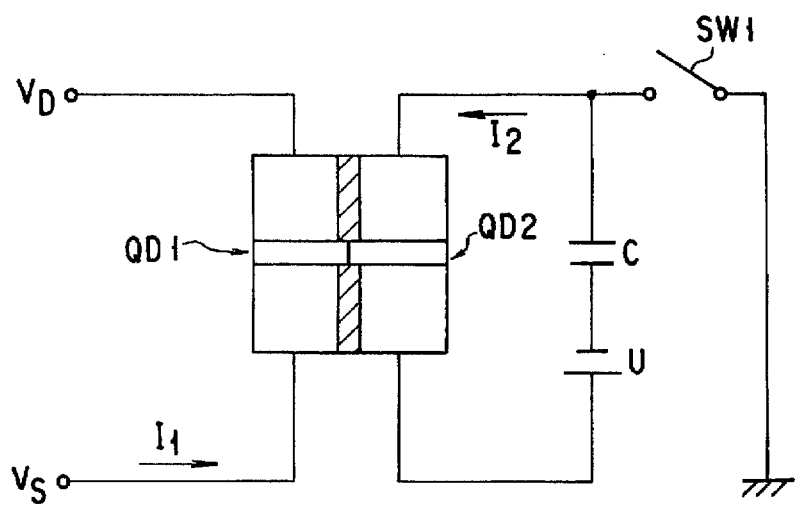
FIG. 7 is a view showing an example wherein a correlation tunnel device according to the third embodiment of the present invention is applied to a memory.

FIG. 7 is a view showing one unit of a memory device. Reference symbol QD1 denotes a first quantum dot, and reference symbol QD2 denotes a second quantum dot. As in the second embodiment described above, first and second conduction regions arranged adjacent to the first quantum dot QD1 are used as source and drain electrodes, respectively, and a third conduction region accompanied the second quantum dot QD2 is used as a gate electrode. The gate electrode of the second quantum dot QD2 is biased with a voltage, supplied by the power unit, through a capacitor C.

The magnitude of the voltage U is set to satisfy the above condition (2): $E_{2l}<\mu_{2R}<\mu_{2L}<E_{2u}$. The state of memory (1, 0) depends on whether the capacitor C is charged up or not. In this case, a source voltage $V_S$ and drain voltage $V_D$ of the first quantum dot QD1 are applied to satisfy the condition (1): $\mu_{1L}>E_{1u}>E_{1l}>\mu_{1R}$. In the first and second quantum dots QD1 and QD2, currents flow in the directions indicated by $I_1$ and $I_2$ in FIG. 7, respectively, thereby gradually charging the capacitor C. As the capacitor C is gradually charged, the condition (2) is not satisfied in the second quantum dot QD2. At the same time, a current rarely flows in the circuit system ($I_1$ and $I_2$ are nearly equal to zero). The charging process for the capacitor C corresponds to write access to the memory.

The state of the memory is known by sensing whether a current flows between $V_S$ and $V_D$. This sensing operation is, as understood from FIG. 4 described above, performed by using a sharp change in the conductance between $V_S$ and $V_D$. That is, a high conductance represents a state wherein the capacitor C is not charged up, and the memory state corresponds to "0". On the other hand, a low conductance represents that the capacitor C is charged up, and the memory state corresponds to "1".

In order to perform an erase operation for information written in the memory, as shown in FIG. 7, a switch SW1 is arranged in the circuit system to discharge charges stored in the capacitor C. That is, when the switch SW1 is closed, the charges in the capacitor C flows to the ground, thereby erasing the information in the memory.

According to the third embodiment described above, the correlation tunnel device of the present invention can also be used as a so-called DRAM.

When the electrochemical potential $\Delta\mu_{2L}$ of the third conduction area of the second quantum dot structure slightly changes with respect to 0, the conductance between the first and second conduction regions of the first quantum dot, i.e., the conductance between $V_S$–$V_D$, abruptly changes. When this phenomenon is used, the correlation tunnel device of the present invention can be applied as a high-sensitive sensor.

(Fourth Embodiment)

The fourth embodiment describes a method of realizing the energy levels of quantum dots required for a correlation tunnel device according to the present invention and an energy band structure of conduction regions coupled to the quantum dots.

Figures 8A, 8B:
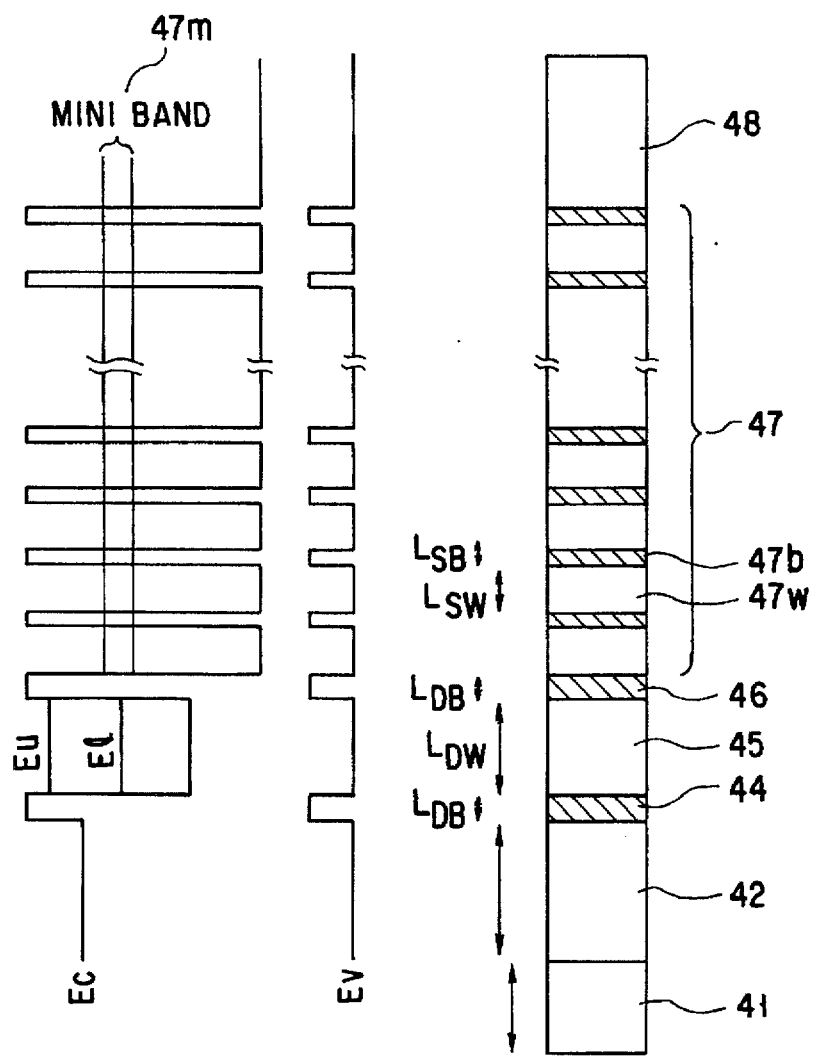
FIG. 8A is an energy band diagram showing a quantum dot structure in the fourth embodiment of the present invention.
FIG. 8B is a diagram showing the quantum dot structure according to the fourth embodiment of the present invention.

A quantum dot structure according to the present invention is, as typically shown in FIG. 8B, constituted by stacking compound semiconductor layers having different types of electronegativities. In this embodiment, a n-type $Ga_yIn_{1-y}As$ layer 42 having a thickness of about 200 nm is stacked on a semi-insulating bulk GaAs substrate 41, and an AlSb barrier layer 44 having a thickness of $L_{DB}$, a $Ga_xIn_{1-x}As$ quantum well layer 45 having a thickness of $L_{DW}$, an AlSb barrier layer 46 having a thickness of $L_{DB}$, an InAs— AlSb superlattice layer 47, and an InAs buffer layer 48 are sequentially stacked on the n-type $Ga_yIn_{1-y}As$ layer 42.

In this case, a mixed crystal ratio y of the n-type $Ga_yIn_{1-y}As$ layer 42 is preferably set to be about 0.75, and a mixed crystal ratio x of the $Ga_xIn_{1-x}As$ quantum well layer 45 is preferably set to be about 0.5. The thicknesses $L_{DB}$ of the barrier layers 44 and 46 are set to be 5 nm or less, and the thickness $L_{DW}$ of the $Ga_xIn_{1-x}As$ quantum well layer 45 is set to be about 8 nm. In addition, the InAs—AlSb superlattice layer 47 is formed by alternately, periodically stacking InAs layers 47w each having a thickness $L_{SW}$ of 7 to 8 nm and AlSb layers 47b each having a thickness $L_{SB}$ of 3 or less such that a conductive mini-band 47m is formed at a portion near a ground level $E_1$ of the quantum dot.

FIG. 8A shows an energy band diagram along the layer direction of the quantum dot structure manufactured as described above.

When the above structure shown in FIG. 8B is employed, a quantum dot structure which has an energy band structure which restrains carrier transport between a quantum dot and a conduction regions, which required for the correlation tunnel device according to the present invention is realized.

(Fifth Embodiment)

A method of manufacturing a coupled quantum dot structure obtained by combining two quantum dots having the above arrangement will be described below with reference to FIGS. 9 to 14.

Figure 9:
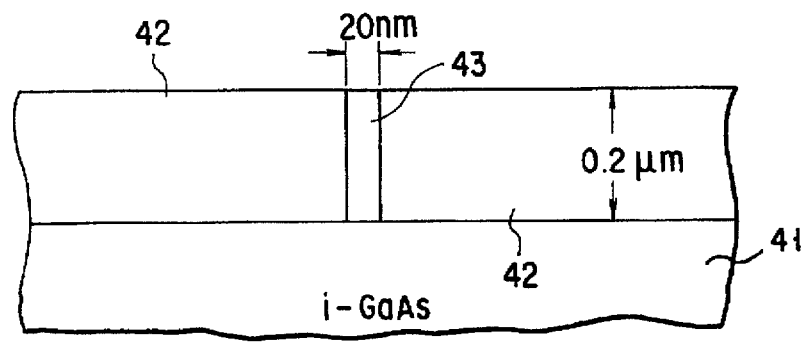
FIGS. 9 to 13 are sectional views showing the steps in manufacturing a correlation tunnel device according to the fifth embodiment of the present invention.

As shown in FIG. 9, a stripe silicon oxide film 43 having a width of about 20 nm is left on a semi-insulating bulk GaAs substrate 41, an n-type GaAs or $Ga_yIn_{1-y}As$ layer 42 having a thickness of about 0.2 μm is epitaxially grown by an MBE method or an MOCVD method. When the $Ga_yIn_{1-y}As$ layer is used, y is preferably set to be 0.75 or more. In addition, a groove may be formed in the n-type epitaxial substrate or the $Ga_yIn_{1-y}As$ layer by etching. Another insulating film may be used in place of the silicon oxide film.

Figure 10:
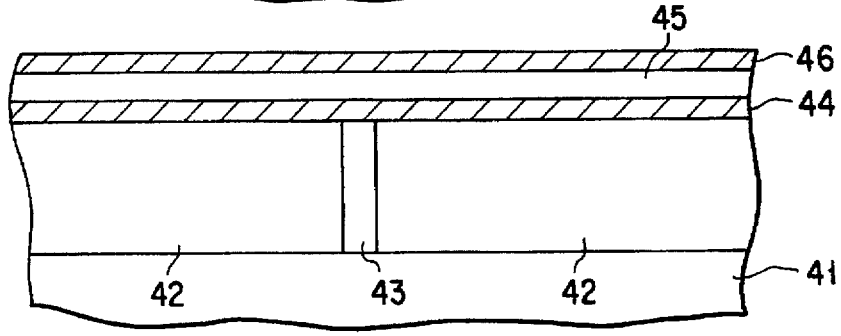
Figure 11:
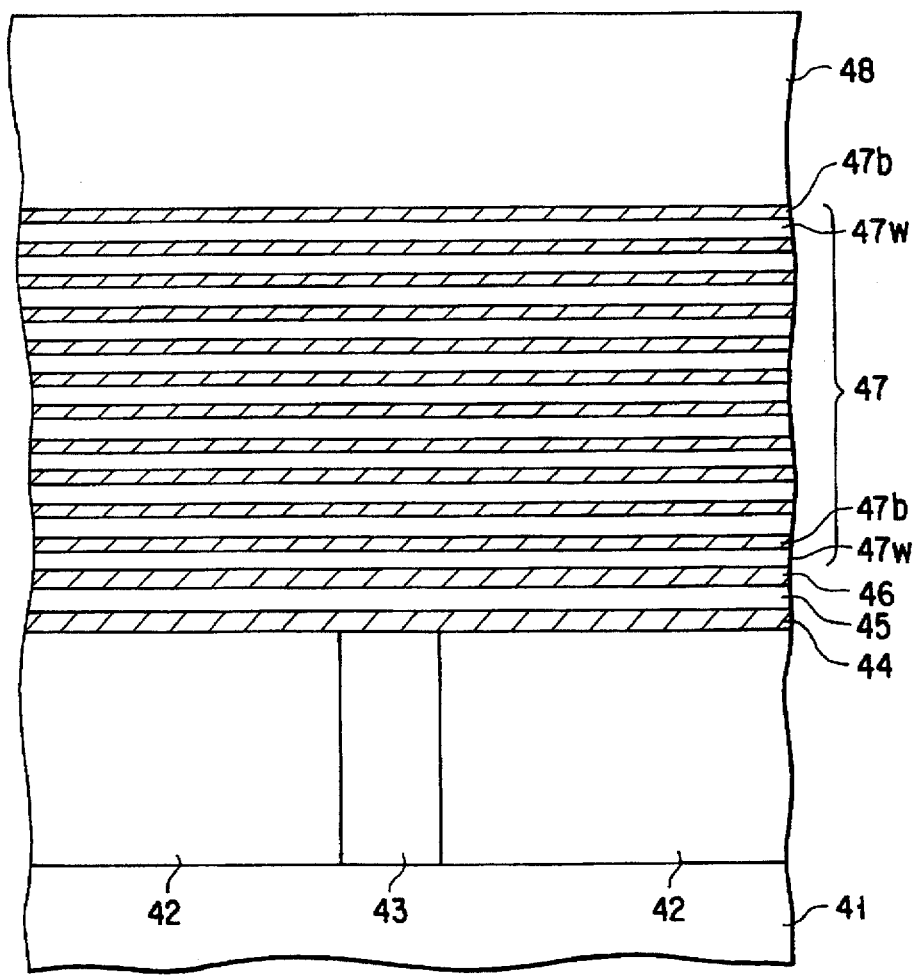

As shown in FIG. 10, an AlSb barrier layer 44 having a thickness of about 5 nm, a $Ga_xIn_{1-x}As$ quantum well layer 45 having a thickness of about 8 nm, and an AlSb barrier layer 46 having a thickness of about 5 nm are continuously grown by an MBE method or an MOCVD method on the layer 42 including the silicon oxide film 43. The layers 44, 45, and 46 form a barrier layer for the quantum dots. In the $Ga_xIn_{1-x}As$ quantum well layer 45, x is preferably set to be about 0.5. Subsequently, as shown in FIG. 11, ten InAs layers 47w each typically having a thickness of 8 nm and ten AlSb layers 47b each having a thickness of 3 nm are alternately grown and stacked on each other. This multi-layered structure forms an InAs—AlSb superlattice layer 47, and the mini-band shown in FIG. 8A is formed in the InAs—AlSb superlattice layer 47. Although the InAs—AlSb superlattice layer 47 is constituted by ten pairs of layers, the number of layers can be arbitrary changed depending on a voltage to be used or an operation temperature or the like. Thereafter, an InAs buffer layer 48 is grown on the uppermost layer of the superlattice layer 47 to form an ohmic contact.

The layers on the semi-insulating bulk GaAs substrate 41 are vertically etched to separate quantum dots from each other. In this embodiment, since an interaction between two quantum dots is important, a portion concerning the separation process of two quantum dots will be described below.

Figure 12:
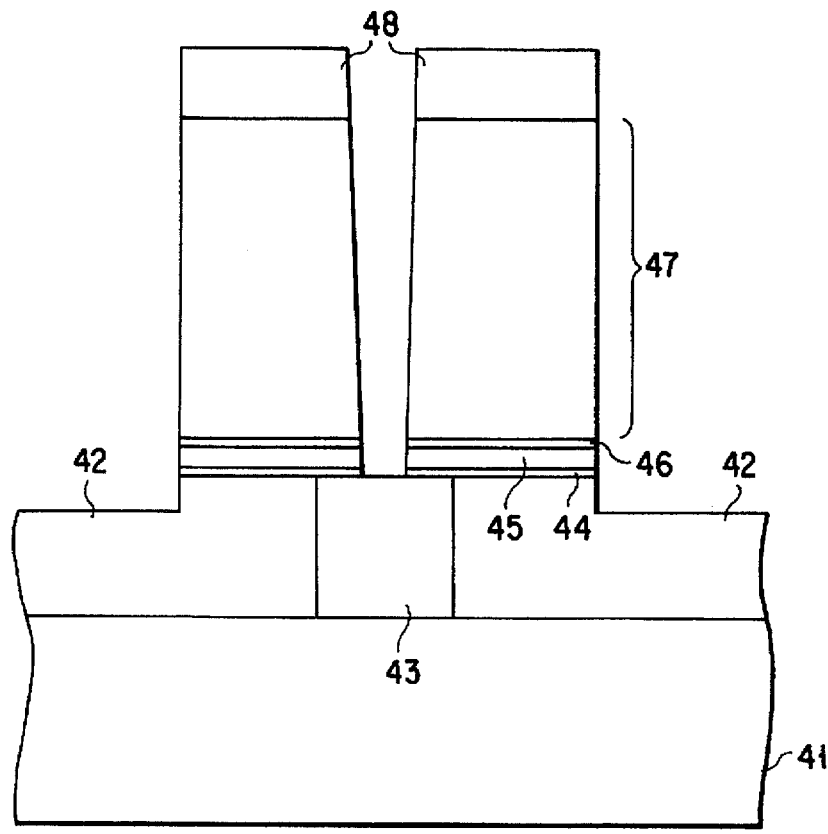

As shown in FIG. 12, the resultant structure is vertically etched in a space of 8 nm to leave the upper electrode portions of the superlattice 47 and the quantum dot portions. At this time, when the etching is performed to form forward tapers each having an angle of 80°, an interval between the two quantum dot portions becomes about 5 nm. With this etching, the two quantum dot portions serving as the basic portion of the device of the present invention are parallel connected to each other. An energy band diagram formed as described above is the same as that in FIG. 8A. In addition, since Coulomb interaction acting between the quantum dot structures in a part of the quantum dot enlarges by forming the taper etching, the function of the correlation tunnel element described in the first embodiment is achieved.

Figure 13:
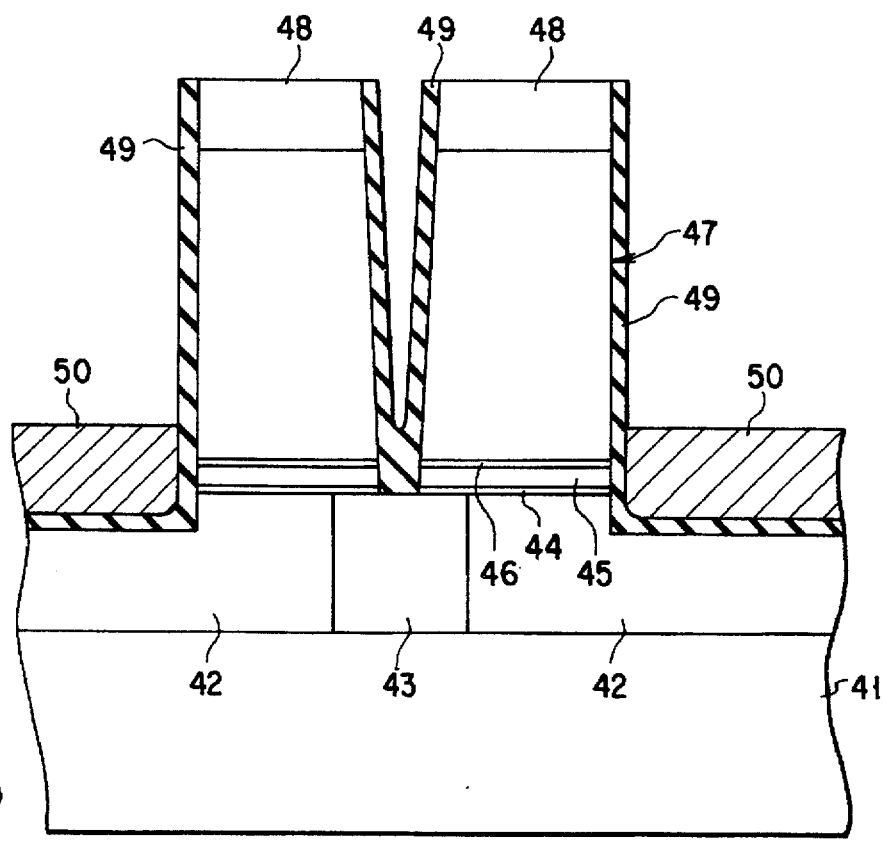

As shown in FIG. 13, a gate 50 is formed on each side wall of the resultant structure through an insulating film 49. A metal layer serving as the gate can be formed by a lift-off method. The gate 50 may be patterned by conventional lithography. FIG. 14 is a perspective view showing the completed state of the correlation tunnel device structure in the fifth embodiment.

(Sixth Embodiment)

The sixth embodiment exemplifies a correlation tunnel device having a structure in which three quantum dots are two-dimensionally arranged adjacent to each other. The sixth embodiment describes, as in the first embodiment, an example wherein physical characteristics such as "spatial correlation of charged carriers caused by Coulomb interaction" are used, and the charged carriers are electrons.

FIG. 15 is a view showing a correlation tunnel device according to the sixth embodiment. A first quantum dot structure 10 is constituted by a first confinement region (quantum dot) 11, fist and second conduction regions 14 and 15 adjacent to the first confinement region 11, and first and second energy barriers 12 and 13 respectively arranged only between the first quantum dot 11 and the first and second conduction regions 14 and 15. A second quantum dot structure 20 is constituted by a second confinement region (quantum dot) 21, third and fourth conduction regions 24 and 25 adjacent to the second quantum dot 21, and third and fourth energy barriers 22 and 23 respectively arranged only between the second quantum dot 21 and the third and fourth conduction regions 24 and 25. A third quantum dot structure 30 is constituted by a third confinement region (quantum dot) 31, fifth and sixth conduction regions 34 and 35 adjacent to the third quantum dot 31, and fifth and sixth energy barriers 32 and 33 respectively arranged only between the third quantum dot 31 and the fifth and sixth conduction regions 34 and 35.

Figure 16:
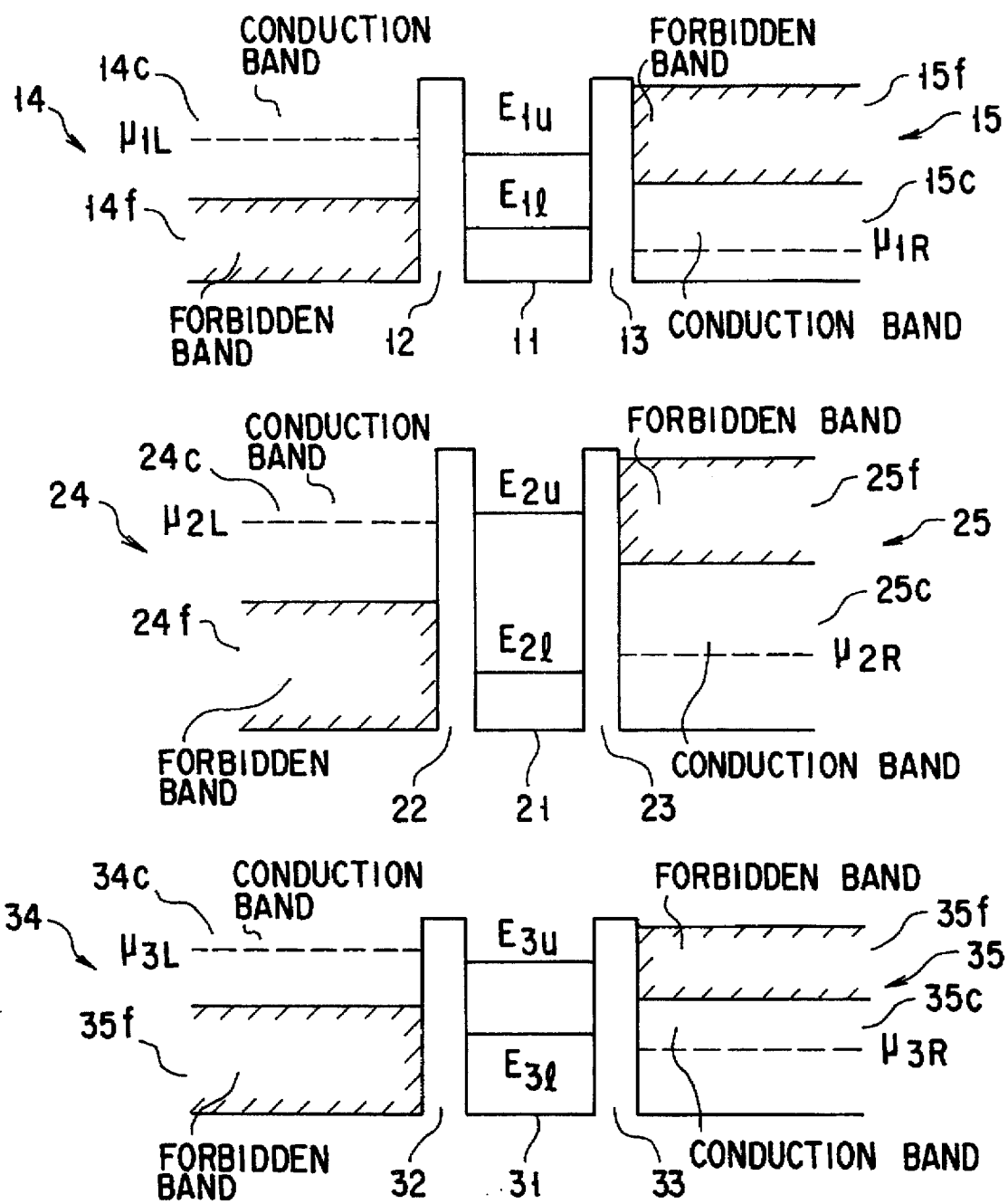
FIG. 16 is a typical energy band diagram showing the correlation tunnel device shown in FIG. 15.

In general, in a quantum dot with a discrete energy level structure, an energy level interval is in inverse proportion to the square of the characteristic length representing the size of the quantum dot. More specifically, as the quantum dot becomes small in size, the energy level interval increases in inverse proportion to the square of the characteristic length of the quantum dot. Therefore, when the quantum dot is sufficiently small in size, a situation considered as a two-level system consisting of a ground energy level and a first excitation level can be formed. A case wherein the following conditions (1) and (2) are satisfied will be described below. (1) Assume that the size of each quantum dot is sufficiently small, and that, as shown in FIG. 16, two levels, i.e., a ground energy level and a first excitation energy level are formed in each quantum dot. (2) Assume that the confinement potentials of the first to third quantum dots 11, 21, and 31 can be approximated to a square well potentials as shown in the energy band structure in FIG. 16. In practice, however, a multi-level system can be employed in which each quantum dot may have two or more energy levels, and the confinement potentials need not be square well ones.

In a confinement potential of the quantum dot as shown in FIG. 16, the first quantum dot 11 has a quantum state consisting of an energy level $E_{1l}$ (ground level) and an energy level $E_{1u}$ (first excitation level), the second quantum dot 21 has a quantum state consisting of an energy level $E_{2l}$ (ground level) and an energy level $E_{2u}$ (first excitation level), and the third quantum dot 31 has a quantum state consisting of an energy level $E_{3l}$ (ground level) and an energy level $E_{3u}$ (first excitation level), where relationships $E_{1l} < E_{1u}$, $E_{2l} < E_{2u}$, and $E_{3l} < E_{3u}$ are satisfied. At this time, the first and second conduction regions 14 and 15 adjacent to the first quantum dot 11 are formed such that their energy bands have a structure shown in FIG. 16. The third and fourth conduction regions 24 and 25 adjacent to the second quantum dot 21 are formed such that their energy bands have a structure shown in FIG. 16. The fifth and sixth conduction regions 34 and 35 adjacent to the third quantum dot 31 are formed such that their energy bands have a structure shown in FIG. 16.

More specifically, in the first quantum dot structure 10, one conduction region (first conduction region 14) has an energy band structure in which a conduction band 14c is put on a forbidden band 14f in order of energy. In this region, upper band edge of the forbidden band 14f is higher than the ground energy level $E_{1l}$ of the first quantum dot 11 and lower than the excitation level $E_{1u}$. That is, the forbidden band 14f extends over the energy region such that electrons do not directly tunnel between the conduction band 14c above the forbidden band 14f and the ground energy level $E_{1l}$ of the first quantum dot 11. The other conduction region (second conduction region 15) has an energy band structure in which a forbidden band 15f is put on a conduction band 15c in order of energy. The conduction band 15c extends to the energy region lower than the excitation level $E_{1u}$ of the first quantum dot 11 which contains the energy level $E_{1l}$ of the first quantum dot 11, and the forbidden band 15f is put on the conduction band 15c and extends over the energy region including the excitation level $E_{1u}$ of the first quantum dot 11 that electrons do not directly tunnel between the excitation level $E_{1u}$ of the first quantum dot 11 and the conduction band 15c.

In addition, as in the first quantum dot structure 10, in the second quantum dot structure 20, one conduction region (third conduction region 24) has an energy band structure in which a forbidden band 24f and a conduction band 24c are energetically arranged in this order. The forbidden band 24f has an upper bound such that an energy region having an energy level extends to higher than the ground energy level $E_{2l}$ of the quantum dot 21 and lower than the excitation level $E_{2u}$. That is, the forbidden band 24f has energy width which is extended such that electrons do not directly tunnel between the conduction band 24c above the forbidden band 24f and the ground energy level $E_{2l}$ of the second quantum dot 21. The other conduction region (fourth conduction region 25) has an energy band structure in which a conduction band 25c and a forbidden band 25f are energetically arranged in this order. The conduction band 25c extends to an energy region having an energy level equal to the ground energy level $E_{2l}$ of the quantum dot 21 and lower than the excitation level $E_{2u}$, and the forbidden band 25f extends in a region including the excitation level $E_{2u}$ of the second quantum dot 11 and located above the conduction band 15c such that electrons do not directly tunnel between the excitation level $E_{2u}$ of the second quantum dot 21 and the conduction band 25c.

Furthermore, in the third quantum dot structure 30, one conduction region (fifth conduction region 34) has an energy band structure in which a forbidden band 34f and a conduction band 34c are energetically arranged in this order. The forbidden band 34f has an upper bound such that an energy region having an energy level extends to higher than the ground energy level $E_{3l}$ of the third quantum dot 31 and lower than the excitation level $E_{3u}$. That is, the forbidden band 34f has energy width which is extended such that electrons do not directly tunnel between the conduction band 34c above the forbidden band 34f and the ground state $E_{3l}$ of the third quantum dot 31. The other conduction region (sixth conduction region 35) has an energy band structure in which a conduction band 35c and a forbidden band 35f are energetically arranged in this order. The conduction band 35c extends to an energy region having an energy level equal to the energy level $E_{3l}$ of the third quantum dot 31 and lower than the excitation level $E_{3u}$, and the forbidden band 35f extends in a region including the excitation level $E_{3u}$ of the third quantum dot 31 and located above the conduction band 35c such that electrons do not directly tunnel between the excitation level $E_{3u}$ of the third quantum dot 31 and the conduction band 35c.

Using these energy band structures, conduction regions to which electrons in the first to third quantum dots 11, 21, and 31 can tunnel through the tunnel barriers depend on the energy levels at which these electrons stay in the quantum dot. For example, in the first quantum dot 11, if an electron exists at the ground energy level $E_{1l}$ of the first quantum dot 11, the electrons can tunnel to only the second conduction region 15 having the conduction band 15c near the energy level $E_{1l}$ through the second energy barrier 13, but cannot tunnel to the other conduction region, i.e., the first conduction region 14. On the other hand, if an electron exists at the excitation level $E_{1u}$ of the first quantum dot 11, the electron can tunnel to only the first conduction region 14 having the conduction band 14c near the excitation level $E_{1u}$ through the first energy barrier 12. In the second quantum dot 21, the same electron tunneling as in the first quantum dot 11 occurs between the third conduction region 24 and the second quantum dot 21 and between the fourth conduction region 25 and the second quantum dot 21. In the third quantum dot 31, the same electron tunneling as in the first quantum dot 11 occurs between the sixth conduction region 35 and the third quantum dot 31 and between the fifth conduction region 34 and the third quantum dot 31.

In this case, although a forbidden band is used as a region in which an electron cannot exist, anything state having no energy level to ply the rule equivalent to the forbidden band, e.g., any available for electrons can be substituted for the forbidden band. Similarly, not only a conduction band, but also any state having an energy level contributing to conduction can be used.

The first and second quantum dots 11 and 21, which having the above energy levels and band structures belong to the first and second quantum dot structures 10 and 20, are arranged adjacent to each other to effectively cause a Coulomb interaction on a carrier in the first quantum dot 11 and a carrier in the second quantum dot 21. In this manner, an energy level occupied by the carrier in the first quantum dot 11 and an energy level occupied by the carrier in the second quantum dot 21 have a correlation. More specifically, if a carrier exists in the excitation level $E_{1u}$ of the first quantum dot 11, a carrier enters the ground energy level $E_{2l}$ of the second quantum dot 21, but a carrier cannot enter the excitation level $E_{2u}$. On the other hand, if a carrier exists in the ground energy level $E_{1l}$ of the first quantum dot 11, a carrier enters the excitation level $E_{2u}$ of the second quantum dot 21, but a carrier cannot enter the ground energy level $E_{2l}$.

The second and third quantum dots 21 and 31, which belong to the first and the second quantum dot structures 20 and 30 having the above energy levels and band structures, are arranged adjacent to each other to effectively cause a Coulomb interaction on a carrier in the second quantum dot 21 and a carrier in the third quantum dot 31. In this manner, an energy level occupied by the carrier in the second quantum dot 21 and an energy level occupied by the carrier in the second quantum dot 21 have a correlation. More specifically, if a carrier exists in the excitation level $E_{2u}$ of the second quantum dot 21, a carrier enters the ground energy level $E_{3l}$ of the third quantum dot 31, but a carrier cannot enter the excitation level $E_{3u}$. On the other hand, if a carrier exists in the ground energy level $E_{2l}$ of the second quantum dot 21, a carrier enters the excitation level $E_{3u}$ of the third quantum dot 31, but a carrier cannot enter the ground energy level $E_{3l}$.

In addition, the energy levels of the first to third quantum dots 11, 21, and 31 satisfy the following relation (3):

$$\Delta E_2 = \Delta E_1 + \Delta E_3, \quad (3)$$

where $\Delta E_i$ (i=1, 2, 3) is an energy difference: $\Delta E_i = E_{iu} - E_{il}$ (i=1, 2, 3) between the ground level and excitation level of each quantum dot.

More specifically, the level interval in the second quantum dot 21 is set to be nearly equal to the sum of the level intervals in the first and third quantum dots 11 and 31. As described above, the energy band of a conduction region coupled to a quantum dot is defined such that a change in energy is caused when a carrier passes through the quantum dot. However, the change in energy are rarely caused as a total of the changes in energy of the quantum dots in accordance with the condition (3). It is the best that value of both parts in energy are preferably equal to each other in expression (3).

Figure 17:
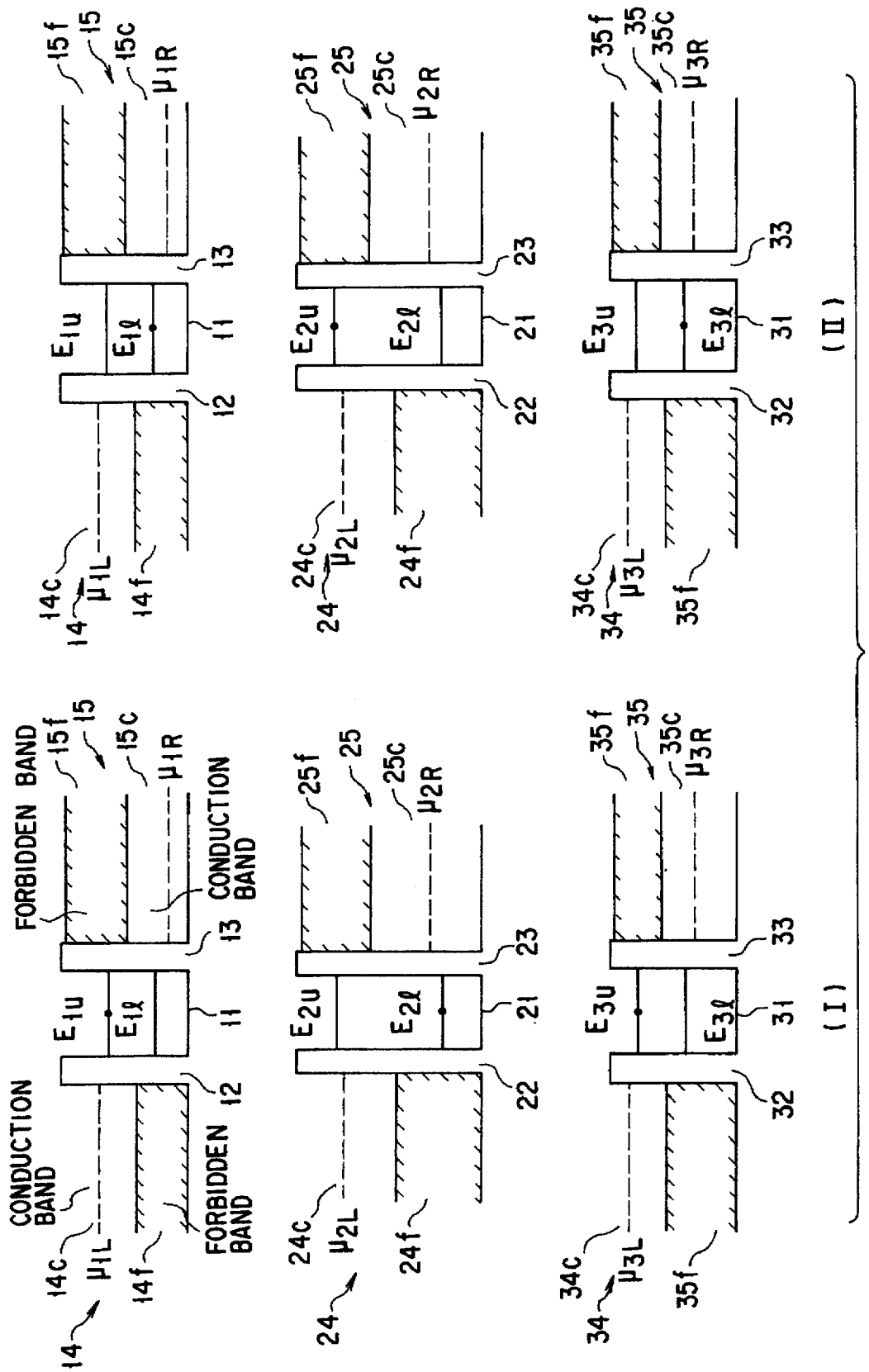
FIG. 17 is a schematic view showing transitions between two states in the quantum mechanical system consisting of the three quantum dot structures in FIG. 15.

Under the above condition, quantum states indicated by (I) and (II) in FIG. 17 become degenerate states which are energetically equivalent to each other. The state (I) in FIG. 17 is transferred to the state (II) in FIG. 17 as time, and then returns to the state (I). The process of (I)→(II)→(I) is repeated. In the quantum dot structure in which quantum dots are coupled to each other by oscillations between the states (I) and (II), a carrier can be transferred with little energy dissipation as a whole. For this purpose, bias voltages are preferably applied to the first to sixth carrier conduction regions 13, 14, 23, 24, 34, and 35 such that the electrochemical potentials $\mu_{1L}$, $\mu_{1R}$, $\mu_{2L}$, $\mu_{2R}$, $\mu_{3L}$, and $\mu_{3R}$ satisfy the following conditions (4, 4-1 to 4-3) or conditions (5, 5-1 to 5-3).

$$\mu_{1L} > E_{1L} > E_{1l} > \mu_{1R} \quad (4\text{-}1)$$

$$\mu_{2L} > E_{2u} > E_{2l} > \mu_{2R} \quad (4\text{-}2)$$

$$\mu_{3L} > E_{3u} > E_{3l} > \mu_{3R} \quad (4\text{-}3)$$

or $$E_{1u} > \mu_{1L} > \mu_{1R} > \mu_{1l} \quad (5\text{-}1)$$

$$\mu_{2L} > E_{2u} > E_{2l} > \mu_{2R} \quad (5\text{-}2)$$

$$E_{3u} > \mu_{3L} > \mu_{3R} > E_{3l} \quad (5\text{-}3)$$

A case wherein an electron is used as a carrier will be described below with reference to the above conditions.

Under the conditions in (4), electrons flow from the conduction region 14 to the conduction region 15 in the first quantum dot structure 10, electrons flow from the conduction region 25 to the conduction region 24 in the second quantum dot structure 20, and electrons flow from the conduction region 34 to the conduction region 35 in the third quantum dot structure 30. Since electrons flow from a portion having a high electrochemical potential to a portion having a low electrochemical potential in each of the first and third quantum dot structures 10 and 30, currents flow in the forward direction with respect to the applied bias voltage. In contrast to this, since electrons flow from a portion having a low electrochemical potential to a portion having a high electrical potential in the second quantum dot structure 20, current flows in the backward direction with respect to the applied bias voltage. That is, energy given off from the first and third quantum dots 11 and 31 are recovered by the second quantum dot 21.

Under the conditions in (5), electrons flow from the conduction region 15 to the conduction region 14 in the first quantum dot structure 10, electrons flow from the conduction region 24 to the conduction region 25 in the second quantum dot structure 20, and electrons flow from the conduction region 35 to the conduction region 34 in the third quantum dot structure 30. Since electrons flow from a portion having a high electrochemical potential to a portion having a low electrical potential in the second quantum dot structure 20, a current flows in the forward direction with respect to the applied bias voltage. In contrast to this, since electrons flow from a portion having a low electrochemical potential to a portion having a high electrochemical potential in each of the first and third quantum dot structures 10 and 30, currents flow in the backward direction with respect to the applied bias voltage. That is, energy discharged from the second quantum dot 21 is recovered by the first and third quantum dots 11 and 31.

Therefore, if any one of the conditions described in (4) is not satisfied, the flow of carriers are abruptly suppressed in all the quantum dots. The same effect as described can be obtained under the conditions described in (5).

A two-terminal logic device can be constituted by the above characteristics. The two-terminal "AND" logic device will be described below. In the following description, assume that a carrier is an electron, that a current flows when the conditions in (4) are satisfied, and that the first quantum dot structure 10 has the same energy level (band) structure as that of the third quantum dot structure 30.

As two inputs, voltages $V_{1R}$ and $V_{3R}$ applied to control the electrochemical potentials $\mu_{1R}$ and $\mu_{3R}$ of the second conduction region 15 of the first quantum dot structure 10 and the sixth conduction region 35 of the third quantum dot structure 30 are used. The electrochemical potentials except for the electrochemical potentials $\mu_{1R}$ and $\mu_{3R}$ are fixed to satisfy the conditions in (4). An AND operation result (output) of the inputs is determined on the basis of the ON/OFF state of a current in the second quantum dot structure 20. More specifically, "1" is set in the ON state, and "0" is set in the OFF state. Among the electrochemical potentials $\mu_{1R}$ and $\mu_{3R}$, a chemical potential which satisfy $\mu_{1R} > E_{1l} = E_1$ or $\mu_{3R} > E_{3l} = E_1$ and set not to generate a current is represented by $\mu_{high,R}$. In addition, a chemical potential which $\mu_{1R} < E_{1l} = E_1$ or $\mu_{3R} < E_{3l} = E_1$ is satisfied and generate a current is represented by $\mu_{low,R}$. When the potentials $\mu_{high,R}$ and $\mu_{low,R}$ are represented by bias voltages, the potentials $\mu_{high,R}$ and $\mu_{low,R}$ correspond to a low-level input voltage $V_{low,R}$ and a high-level input voltage $V_{high,R}$, respectively. An output current of the second quantum dot structure at this time is expressed by Table 1, and the input/output state of the logic gate is expressed by Table 2:

TABLE 1

| | $\mu_{1R}$ | |
|---|---|---|
| $\mu_{3R}$ | $\mu_{high,R}$ | $\mu_{low,R}$ |
| $\mu_{high,R}$ | OFF | OFF |
| $\mu_{low,R}$ | OFF | ON |

TABLE 2

| | $V_{1R}$ | |
|---|---|---|
| $V_{3R}$ | $V_{low,R}$ | $V_{high,R}$ |
| $V_{low,R}$ | 0 | 0 |
| $V_{high,R}$ | 0 | 1 |

Therefore, an "AND" logic device having a low power consumption can be realized by the correlation tunnel element having the above arrangement.

Next, a two-terminal "NOR" logic device will be described below. In the following description, assume that a carrier is an electron, that a current flows when the conditions in (4) are satisfied, and that the first quantum dot structure 10 has the same energy level (band) structure as that of the third quantum dot structure 30.

As two inputs, voltages $V_{1L}$ and $V_{3L}$ applied to control the electrochemical potentials $\mu_{1L}$ and $\mu_{3L}$ of the first conduction region 14 of the first quantum dot structure 10 and the fifth conduction region 34 of the third quantum dot structure 30 are used. The electrochemical potentials except for the electrochemical potentials $\mu_{1L}$ and $\mu_{3L}$ are fixed to satisfy the conditions in (4). A NOR operation result (output) of the inputs is determined on the basis of the ON/OFF state of a current in the second quantum dot structure 20. More specifically, "1" is set in the ON state, and "0" is set in the OFF state. An electrochemical potential which satisfy $\mu_{1L} > E_{1u} = E_u$ or $\mu_{3L} > E_{3u} = E_u$, and is set not to generate a current is represented by $\mu_{high,L}$. In addition, an electrochemical potential which $\mu_{1L} < E_{1l} = E_1$ or $\mu_{3L} < E_{3l} = E_1$ is satisfied and as set to generate a current is represented by $\mu_{low,L}$.

When the potentials $\mu_{high,L}$ and $\mu_{low,L}$ are represented by bias voltages, the potentials $\mu_{high,L}$ and $\mu_{low,L}$ correspond to a low-level input voltage $V_{low,L}$ and a high-level input voltage $V_{high,L}$. An output current of the second quantum dot structure at this time is expressed by Table 3, and the input/output state of the logic gate is expressed by Table 4:

TABLE 3

| | $\mu_{11}$ | |
|---|---|---|
| $\mu_{3L}$ | $\mu_{high,L}$ | $\mu_{low,L}$ |
| $\mu_{high,L}$ | ON | OFF |
| $\mu_{low,L}$ | OFF | OFF |

TABLE 4

| | $V_{11}$ | |
|---|---|---|
| $V_{3L}$ | $V_{low,L}$ | $V_{high,L}$ |
| $V_{low,L}$ | 1 | 0 |
| $V_{high,L}$ | 0 | 0 |

Therefore, "NOR" logic device having a low power consumption can be realized the correlation tunnel element having above arrangement.

This "NOR" logic device, as is apparent from Table 4, can operate as an inverter having, as one input, a voltage $V_{3L}$ for controlling the fifth carrier conduction region when the voltage $V_{1L}$ for controlling the electrochemical potential $\mu_{1L}$ of the first carrier conduction region 14 of the first quantum dot structure 10 is fixed to a voltage $V_{low,L}$.

In addition, according to the second embodiment, a correlation tunnel device which operates as an inverter can also be constituted by a coupled-quantum-dot structure obtained by coupling two quantum dots to each other.

Although the sixth embodiment describes the correlation tunnel device in which the three quantum dots are coupled to each other, the scope of the present invention can extends to a correlation tunnel device in which four or more quantum dots are coupled to each other.

In the embodiment described above, the correlation between the energy levels which the carriers occupy in the first and second confinement regions and the energy levels which the carriers occupy in the second and third confinement regions is generated by the Coulomb interaction. Nonetheless, the correlation may be attained by other means, for example by spin interaction.

As described above, according to the present invention, when an energy transfer effect based on inter-quantum-state oscillations between quantum dots coupled to each other is used, in a single device driven by a bias voltage V, almost part of energy qV to be originally discharged and consumed as Joule heat by carriers having charges q can be transferred to another circuit system to recover energy loss. As a result, energy consumed in the device can be reduced, and the device is operated at a relatively high bias voltage. For this reason, the tunnel device free from a decrease in drive force can be constituted.

In addition, the correlation tunnel device according to the present invention is applied to a large-scale-integrated circuit or the like, a low power consumption and a decrease in heat radiation can be achieved without decreasing a drive force.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A correlation tunnel device comprising:
   a first quantum dot structure including a first carrier confinement region having at least two discrete energy levels, a carrier conduction region adjacent to said first carrier confinement region, and a tunnel barrier arranged only between said first carrier confinement region and said conduction region; and
   a second quantum dot structure including a second carrier confinement region having at least two discrete energy levels, a carrier conduction region adjacent to said second carrier confinement region, and a tunnel barrier arranged only between said second carrier confinement region and said conduction region,
   wherein an energy level occupied by the carrier in the first carrier confinement region and an energy level occupied by the carrier in said second carrier confinement region have a correlation.

2. A device according to claim 1, wherein a transfer of a carrier from and to said carrier conduction region adjacent thereto through said first carrier confinement region is performed by changing energy level occupied by the carrier in the first carrier confinement region, and
   a transfer of a carrier from and to said carrier conduction region adjacent thereto through said second carrier confinement region is performed by changing energy level occupied by the carrier in the second carrier confinement region.

3. A device according to claim 1, wherein each of said first and second quantum dot structures has two carrier conduction regions.

4. A device according to claim 3, wherein, of energy levels formed in said first carrier confinement region, an energy level mainly contributing to an exchange of a carrier between said first carrier confinement region and one of said carrier conduction regions is different from an energy level mainly contributing to an exchange of a carrier between said first carrier confinement region and the other of said carrier conduction regions, and
   of energy levels formed in said second carrier confinement region, an energy level mainly contributing to an exchange of a carrier between said second carrier confinement region and one of said carrier conduction regions is different from an energy level mainly contributing to an exchange of a carrier between said second carrier confinement region and the other of said carrier conduction regions.

5. A device according to claim 1, further comprising means for controlling an electrochemical potential of at least one conduction region of said carrier conduction regions.

6. A device according to claim 1, wherein the correlation between energy levels occupied by carrier in said first and second carrier confinement regions is obtained by arranging said first and second confinement regions adjacent to each other such that a Coulomb interaction is generated between charged carriers in the first and second carrier confinement regions.

7. A device according to claim 6, further comprising means for controlling a magnitude of the Coulomb interaction acting between the carriers in the first and second carrier confinement regions.

8. A correlation tunnel device comprising:
- a first quantum dot structure including a first carrier confinement region having at least two discrete energy levels, a carrier conduction region adjacent to said first carrier confinement region, and a tunnel barrier arranged only between said first carrier confinement region and said conduction region;
- a second quantum dot structure including a second carrier confinement region having at least two discrete energy levels, a carrier conduction region adjacent to said second carrier confinement region, and a tunnel barrier arranged only between said second carrier confinement region and said conduction region;
- a third quantum dot structure including a third carrier confinement region having at least two discrete energy levels, a carrier conduction region adjacent to said third carrier confinement region, and a tunnel barrier arranged only between said third carrier confinement region and said conduction region,
- wherein an energy level occupied by the carrier in the first carrier confinement region and an energy level occupied by the carrier in said second carrier confinement region, and the energy level occupied by the carrier in the second carrier confinement region and an energy level occupied by the carrier in said third carrier confinement region have correlations, respectively.

9. A device according to claim 8, wherein a transfer of a carrier from and to said carrier conduction region adjacent thereto through said first carrier confinement region is performed by changing energy level occupied by the carrier in the first carrier confinement region,
- a transfer of a carrier from and to said carrier conduction region adjacent thereto through said second carrier confinement region is performed by changing energy level occupied by the carrier in the second carrier confinement region, and
- a transfer of a carrier from and to said carrier conduction region adjacent thereto through said third carrier confinement region is performed by changing energy level occupied by the carrier in the third carrier confinement region.

10. A device according to claim 8, wherein each of said first, second, and third quantum dot structures has two carrier conduction regions.

11. A device according to claim 10, wherein, of energy levels formed in said first carrier confinement region, an energy level mainly contributing to an exchange of a carrier between said first carrier confinement region and one of said carrier conduction regions is different from an energy level mainly contributing to an exchange of a carrier between said first carrier confinement region and the other of said carrier conduction regions,
- of energy levels formed in said second carrier confinement region, an energy level mainly contributing to an exchange of a carrier between said second carrier confinement region and one of said carrier conduction regions is different from an energy level mainly contributing to an exchange of a carrier between said second carrier confinement region and the other of said carrier conduction regions, and
- of energy levels formed in said third carrier confinement region, an energy level mainly contributing to an exchange of a carrier between said third carrier confinement region and one of said carrier conduction regions is different from an energy level mainly contributing to an exchange of a carrier between said third carrier confinement region and the other of said carrier conduction regions.

12. A device according to claim 8, further comprising means for controlling an electrochemical potential of at least one conduction region of said carrier conduction regions.

13. A device according to claim 8, wherein the correlation between energy levels occupied by carrier in said first and second carrier confinement regions is obtained by arranging said first and second confinement regions adjacent to each other such that a Coulomb interaction is generated between charged carriers in the first and second carrier confinement regions, and the correlation between energy levels occupied by carrier in said second and third carrier confinement regions is obtained by arranging said second and third confinement regions adjacent to each other such that a Coulomb interaction is generated between charged carriers in the second and third carrier confinement regions.

* * * * *